United States Patent [19]

Jinzenji

[11] Patent Number: 4,767,996
[45] Date of Patent: Aug. 30, 1988

[54] FAULT CURRENT DETECTION DEVICE FOR A D.C. NETWORK

[75] Inventor: Toshimasa Jinzenji, Hino, Japan

[73] Assignee: Kabushiki Kaisha Toshiba, Kawasaki, Japan

[21] Appl. No.: 4,430

[22] Filed: Jan. 20, 1987

[30] Foreign Application Priority Data

Jan. 20, 1986 [JP] Japan .................................. 61-9090
Jan. 20, 1986 [JP] Japan .................................. 61-9091
Mar. 6, 1986 [JP] Japan ................................. 61-49163

[51] Int. Cl.$^4$ ............................................. G01R 31/02
[52] U.S. Cl. ..................................... 324/522; 361/93; 364/483
[58] Field of Search ............... 324/522, 535, 509, 500; 340/664, 650; 364/483; 361/93

[56] References Cited

U.S. PATENT DOCUMENTS 4,160,282  7/1979  Dolinar et al. ......................... 361/93
4,707,761  11/1987  Podobinski ........................... 324/500

FOREIGN PATENT DOCUMENTS 0174863  10/1983  Japan .................................. 324/522

OTHER PUBLICATIONS

Instruction Manual for the products of Tsuda Denki Keiki K. K. of Japan, named "FE-12/FE-15 I Type DC Feeder Fault Discriminator", Dec. 1984.
Toshimasa Jinzenji et al, "A GTO DC Circuit Breaker Controlled by a Single-Chip Microcomputer", IEEE Transactions on Industrial Electronics, vol. 1E-32, No. 3, Aug. 1985.
Toshimasa Jinzenji et al, "Microcomputer-Based Protective Relay to Detect DC Feeder Short-Circuit Fault", IECON'86, pp. 504-509.

Primary Examiner—Reinhard J. Eisenzopf
Assistant Examiner—Maura K. Regan
Attorney, Agent, or Firm—Foley & Lardner, Schwartz, Jeffery, Schwaab, Mack, Blumenthal & Evans

[57] ABSTRACT

A fault current detection device which, in order to take into consideration a record in the past of a load current up to a time instance when a short-circuit is caused, operates, every sampling period $\Delta t$, a variable $\Delta I_n = f(I_n, J_{n-1})$ representatve of the record obtainable as a function of an instantaneous current value $I_n$ at nth sampling time and a parameter $J_{n-1}$ obtained by weighting the load current within a preceding specified time period is featured by that the parameter $J_{n-1}$ is substituted by the present current value $I_n$ when a variation of current is in a decreasing direction and that a variable $\Delta I_n = f(D_n, \Delta I_{n-1})$ obtainable as a function of a current varying rate $D_n$ at nth sampling time and a variable $\Delta I_{n-1}$ representative of a current varying rate at $(n-1)$th sampling time is calculated every sampling period $\Delta t$ with variable $\Delta I_n$ being zero when $D_n$ is negative.

7 Claims, 11 Drawing Sheets

FAULT CURRENT DETECTION DEVICE FOR A D.C. NETWORK

BACKGROUND OF THE INVENTION

1. Field of the Invention

The present invention relates to a fault current detection device for discriminating a short-circuit occurred in a d.c. network such as d.c. feeder or trolley of a d.c. electric railway.

2. Description of the Prior Art

A load current flowing through a d.c. feeder of a d.c. electric railway tends to be substantially increased recently with frequency train service and in the number of cars in a train. For this reason, short-circuit current also tends to increase, but the ratio of increase thereof is smaller than that of the load currents. It becomes very important to protect electric cars and/or system devices against short-circuit of the d.c. feeder and/or trolley wire.

A unit length of the d.c. feeder is generally from several to ten kilometers or more. With increase in the capacity of d.c. substation, a peak value of fault current due to a distant short-circuit may be lower than a pick-up setting value of a d.c. high speed circuit breaker for d.c. feeder protection. On the other hand, when the pick-up setting value is selected in a manner that such fault current is reliably cut-off, a maximum value of current to be fed is in inverse-proportion to the length of the feeder and becomes substantially small when the length is large. Therefore, in order to detect a short-circuit fault caused in the d.c. network as early as possible and to reliably cut-off a fault current caused thereby, a selective protecting system in which the fault current is discriminated on the basis of a difference in circuit phenomena between a load current and a short-circuit current and tripped selectively, has been employed.

An example of such a selective trip device is one which utilizes the fact that a rising rate of a usual load current is relatively small and a magnitude of variation thereof is small, while a fault current rises at a higher rate and the variation thereof is large. In such a device, a variable $\Delta I_o$ representative of an amount of current variation caused within a predetermined time constant $t_d$ is monitored continuously and a fault current detection signal is provided when the variable $\Delta I_o$ exceeds a set value $\Delta I_r$. In this selective trip device, a variation of a d.c. current I flowing through the d.c. feeder or trolley wire is detected through a current transformer. The detected variation is supplied to an integrator composed of a parallel circuit of an integrating resistor and an integrating capacitor connected in series with the resistor and an output resistor, a current $\Delta I_o$ flowing through the latter being used to detect a fault.

In such a circuit, a tranfer function G(S) between the current I and the current $\Delta I_o$ can be represented by the following equation (1):

$$G(S) = \Delta I_o(S)/I(S) \quad (1)$$
$$= -MS/(2R \cdot t_d(S + 1/t_d))$$
$$t_d = CR/2$$

where C is a capacitance of the integrating capacitor and R is a resistance of the integrating resistor and the output resistor.

In order to put a circuit phenomenon of the integrating circuit in a primary side of the current transformer, $M = -2Rt_d$ is used in the equation (1). Thus, the transfer function G(S) can be modified as follows:

$$G(S) = \Delta I_o(S)/I(S) \quad (2)$$
$$= S/(S + 1/t_d)$$

There is a sampling method using a microcomputer as an example of a conventional system operable according to this principle, in which the transfer function represented by the equation (2), is approximated by the following equation (3).

$$\Delta I_n = (I_n - J_{n-1})(1 - \Delta t/t_d) \quad (3)$$

$$J_n = J_{n-1} + \Delta I_n \Delta t/t_d \quad (4)$$

where $\Delta I_n$ is a variable representing an amount of current variation at nth sampling time, $I_n$ is an instantaneous value of current at nth sampling time, $J_n$ is a final value of current weighted at nth sampling time, $J_{n-1}$ is an initial value of current weighted at nth sampling time, $\Delta t$ is a sampling period and $t_d$ is a time constant of the integrating circuit.

In this sampling method, the variable $\Delta I_n$ representing an amount of current variation occurred within a time period shorter than the time constant $t_d$ is monitored continuously and a detected signal is provided when the variable $\Delta I_n$ exceeds a set value $\Delta I_r$. That is, the following equation (5) is a discrimination equation upon which a fault is selectively determined.

$$(I_n - J_{n-1})(1 - \Delta t/t_d) > \Delta I_r \quad (5)$$

On the other hand, another system is also proposed which utilizes not the d.c. current I but a variation thereof, D = dI/dt. When this variation is used, the transfer function G(S) between the variation D and the current $\Delta I_o$ is as follows:

$$G(S) = \Delta I_o(S)/D(S) \quad (6)$$
$$= -M/(2Rt_d(S + 1/t_d))$$

When, in the equation (6), $M = -2Rt_d$ to put the circuit phenomena of the integration circuit in the primary side of the current transformer, the equation (6) can be modified as follows:

$$G(S) = \Delta I_o(S)/D(S)) \quad (7)$$

In the sampling method using a microcomputer operating according to the equation (7), the latter is approximated by the following equation (8).

$$\Delta I_n = \Delta I_{n-1}(1 - \Delta t/t_d) + D_n \cdot \Delta t \quad (8)$$

where $\Delta I_n$ is a variable representing an amount of current variation an nth sampling time, $\Delta I_{n-1}$ is a variable representing an amount of current variation at (n-1)th sampling time, $D_n$ is an instantaneous value of current changing rate at nth sampling time, $\Delta t$ is a sampling period and $t_d$ is a time constant of the integrating circuit.

In this sampling method, the variable $\Delta I_n$ which represents the amount of current variation occurred within a time period shorter than the time constant $t_d$ is monitored continuously as in the former case and a detection signal is provided when the variable $\Delta I_n$ exceeds a set value $\Delta I_r$. That is, a fault is selectively determined according to the following equation (9):

$$\Delta I_{n-1}(1-\Delta t/t_d)+D_n\cdot\Delta t > \Delta I_r \quad (9)$$

It should be noted, however, that the variable $\Delta I_n$ in the equation (3) or (8) is influenced by initial conditions. That is, when a load current reduces abruptly immediately before a short-circuit occurs in a certain feeder section, the variable $\Delta I_n$ may become smaller than that under the initial conditions which are zero. Therefore, under the most undesirable circumstance where a short-circuit is caused immediately after the load current reduces abruptly, the fault tends to be not detected due to the fact that the variable $\Delta I_n$ does not reach the set value.

In order to avoid such a situation, it has been usual to weight the variable $\Delta I_n$ with respect to the load current within a preceding specified time to obtain a collective parameter as the initial condition. For this reason, it is impossible to reflect faithfully a variation of load current immediately before the short-circuit. Thus, it becomes impossible to detect the fault current when the train running becomes frequent and a variation of load current becomes considerable.

SUMMARY OF THE INVENTION

An object of the present invention is to provide a fault current detection device for a d.c. feeder for an electric car, which has a high fault detection performance by taking into consideration a record in the past of load current up to a time point at which a short-circuit is caused.

Another object of the present invention is to provide a fault current detection device which is capable of discriminating a fault current even when a load current reduces abruptly immediately before an occurrence of short-circuit and selectively detecting only the fault current.

In order to achieve these objects, according to the present invention, a variable $\Delta I_n = f(I_n, J_{n-1})$ which represents the record in the past of load current obtainable as a function of an instantaneous current value $I_n$ at nth sampling time and a parameter $J_{n-1}$ obtainable by weighting the current $I_n$ with respect to a load current within a preceding specified time period is calculated at every sampling period $\Delta t$ with the parameter $J_{n-1}$ being substituted by a currently sampled current value $I_n$ when the current is decreasing, to thereby take into consideration the record in the past of load current up to a time of occurrence of a short-circuit.

Further, the present invention is featured by operating a variable $\Delta I_n = f(D_n, \Delta I_{n-1})$ obtainable as a function of a current change rate $D_n$ at nth sampling time and a variable $\Delta I_{n-1}$ representing an amount of current variation at $(n-1)$th sampling time, with the variable $\Delta I_n$ being zero when the rate $D_n$ is negative.

PRINCIPLE OF THE INVENTION

The principle of the present invention will be described firstly with reference to FIG. 1. A load current I flowing from a rectifier transformer M through an ac/dc converter 1, a d.c. high speed circuit breaker 2, a trolley wire 4 and an electric car 5 to a rail 6 is detected by a shunt 3 as a voltage $e_i$ and supplied to a differential circuit 10 composed of a capacitor 8 and a resistor 9. Across the resistor 9, a voltage $e_o$ which is proportional to a derivative value of the voltage $e_i$ (which is proportional to the load current I) appears.

A transfer function $G(S)$ between the terminal voltage $e_i$ of the shunt 3 and the terminal voltage $e_o$ of the differentiating resistor 9 can be expressed as follows:

$$G(S) = e_o(S)/e_i(S) \quad (10)$$
$$= S/(S + 1/t_d)$$

It is clear that the right terms of the equations (10) and (2) are identical in shape. From this fact, it is clear that $e_o$ and $e_i$ in the equation (10) correspond to $I_o$ and I in the equation (2), respectively. Considering a transient phenomenon of the circuit in FIG. 1 with respect to the equation (3), $J_{n-1}$ and $J_n$ in the equation (3) correspond to an initial voltage of the capacitor 8 at $t=0$ and a voltage of the capacitor 8 after a sampling period $\Delta t$ lapses, respectively. This fact shows that the circuit construction shown in FIG. 1 is another expression of the conventional system construction.

In the present invention, the initial voltage $J_{n-1}$ of the capacitor 8 is corrected delicately every sampling time. Although it is very difficult to operate variables by an analog circuit utilizing a charge-discharge function of a conventional RC circuit, a utilization of microcomputer enables a complicated calculation for variables corresponding to the usual initial voltage $J_{n-1}$ of the differentiating capacitor 8. Therefore, it is possible to realize higher fault detection and selective protection functions.

A time period for which a fault current should be discriminated from a load current is a time period for which current is increasing. Therefore, in calculating the variable $\Delta I_n$ according to the equation (3) with using a sample value $I_n$ obtained at nth sampling time, the parameter $J_{n-1}$ providing an initial current value is given as an amount of load current within a preceding specified time period weighted according to the equation (4) in a current increasing time (i.e., $I_n > I_{n-1}$). When a short-circuit fault is caused immediately after the current increase time, the discrimination of the fault is performed according to the equation (5). On the other hand, the parameter $J_{n-1}$ in a current decrease process (i.e., $I_n < I_{n-1}$) is substituted by the current sample value $I_n$. That is, $$J_{n-1} \leftarrow I_n \tag{11}$$

As a result, the variable $\Delta I$ calculated according to the equation (3) becomes zero. In other words, the variable $\Delta I$ in the current decrease time period is regarded as being zero.

Now, the principle of the present invention based on the equation (7) will be described.

Figure 2:
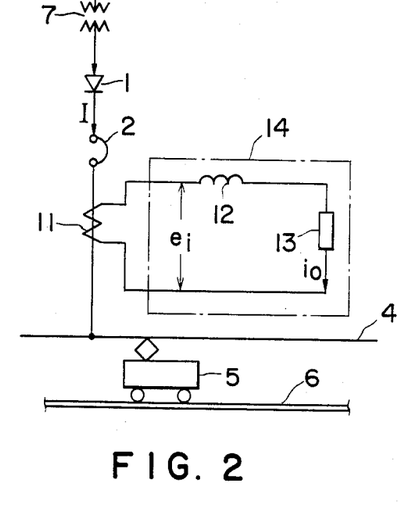

As shown in FIG. 2, the load current I is detected by a current transformer 11 whose secondary current is supplied to an integrator 14 composed of a series circuit of an integrating inductance 12 and an integrating resistor 13. An input impedance of the integrator 14 is set sufficiently high so that a secondary voltage $e_i$ of the transformer 11 is not influenced by an effect of the integrator 14. As a result, the voltage $e_i$ across secondary terminals of the transformer 11 becomes proportional to a variation rate $D_n$ of an output current I.

A transfer function $G(S)$ between the voltage $e_i$ and a current $i_o$ flowing through the series circuit of the inductance 12 and the resistor 13 can be expressed by the equation (12).

$$\begin{aligned} G(S) &= i_o(S)/e_i(S) \\ &= 1/(R \cdot t_d(S + 1/t_d)) \end{aligned} \tag{12}$$

Comparing the right term of the equation (12) with that of the equation (7), they are identical when a coefficient $1/R \cdot t_d = 1$. Therefore, $i_o$ and $e_i$ in the equation (12) correspond to $\Delta I_o$ and $D$ in the equation (7), respectively. Further, considering a transient phenomenon of the circuit in FIG. 2 with respect to the equation (8), $\Delta I_{n-1}$ and $\Delta I_n$ in the latter equation correspond to an initial value of a current flowing through the integrator 14 at $t=0$ and a current value after the sampling period $\Delta t$ lapses, respectively. The above matter shows that it is another expression of the conventional system.

In the present invention, the initial current $\Delta I_{n-1}$ flowing through the integrator 14 is delicately corrected every sampling period $\Delta t$. A utilization of microcomputer enables a complicated calculation of a variable corresponding to the usual initial value $\Delta I_{n-1}$ of current flowing through the integrator 14 and thus a highly reliable selective protection is realized.

A time period for which a fault current should be discriminated from a load current is a time period for which current variation rate is positive. Therefore, in calculating it at nth sampling period, an amount weighted with respect to a variation rate of load current within a preceding specified time period is given as the parameter $\Delta I_{n-1}$ which provides an initial value in a time where the current variation rate is positive. When a short-circuit is caused immediately after the latter time period, the fault discrimination is performed according to the equation (9). On the other hand, the parameter $\Delta I_n$ in a time period in which the current variation rate is negative, i.e., when the current is decreasing, is substituted by:

$$\Delta I_n = 0 \tag{13}$$

In other words, the parameter $\Delta I_n$ is regarded as being zero during the time period in which the variation rate is negative.

DETAILED DESCRIPTION OF THE PREFERRED EMBODIMENTS

Figure 1:
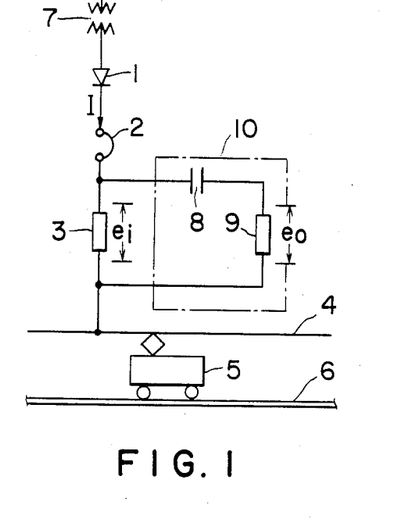
FIGS. 1 and 2 are schematic illustrations of a principle of the present invention, respectively.
Figure 3:
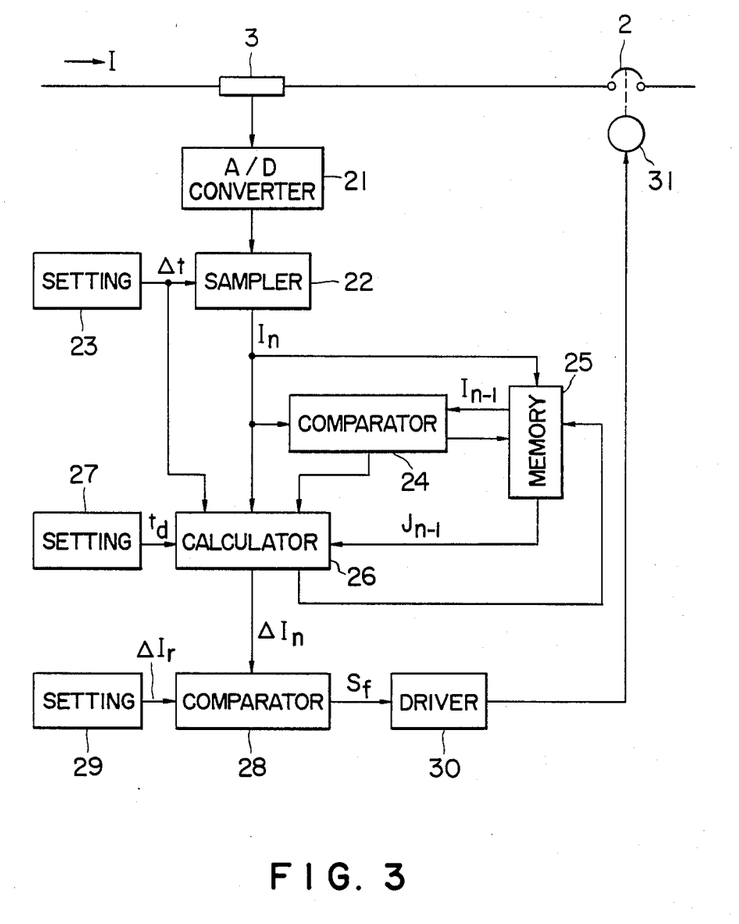
FIG. 3 is a block circuit diagram showing an embodiment of the present invention based on the principle shown in FIG. 1.

FIG. 3 shows an embodiment of the present invention based on the principle shown in FIG. 1. In general, power feeding for a d.c. electric railway in a double track region is performed for respective tracks separately by means of a pair of substations. Therefore, in order to selectively protect feeders in the double track region against fault, four circuitries each shown in FIG. 3 must be prepared.

A load current I detected by a shunt 3 is converted by an A/D converter 21 into a digital signal and sampled by a sampler 22 every sampling period $\Delta t$, and the sample value $I_n$ at nth sampling time is supplied to a comparator 24, a memory 25 and a calculator 26. The sampling period $\Delta t$ is set by a setting device 23. It should be noted that a circuit portion including the sampler 22 to a setting device 29 to be described can be constructed with a microcomputer. The calculator 26 calculates sample values $I_n$ obtained by sequentially sampling the load current I and a parameter $J_{n-1}$ stored in the memory 25 to obtain a variable $\Delta I_n$. The comparator 28 compares the variable $\Delta I_n$ with a set value $\Delta I_r$ preset by the setting device 29 and determines an existence of short-circuit current in the feeder through which the load current is flowing, when $\Delta I_n > \Delta I_r$ to open a d.c. high speed circuit breaker 2 by means of a driver 30 and a trip coil 31.

Figure 4:
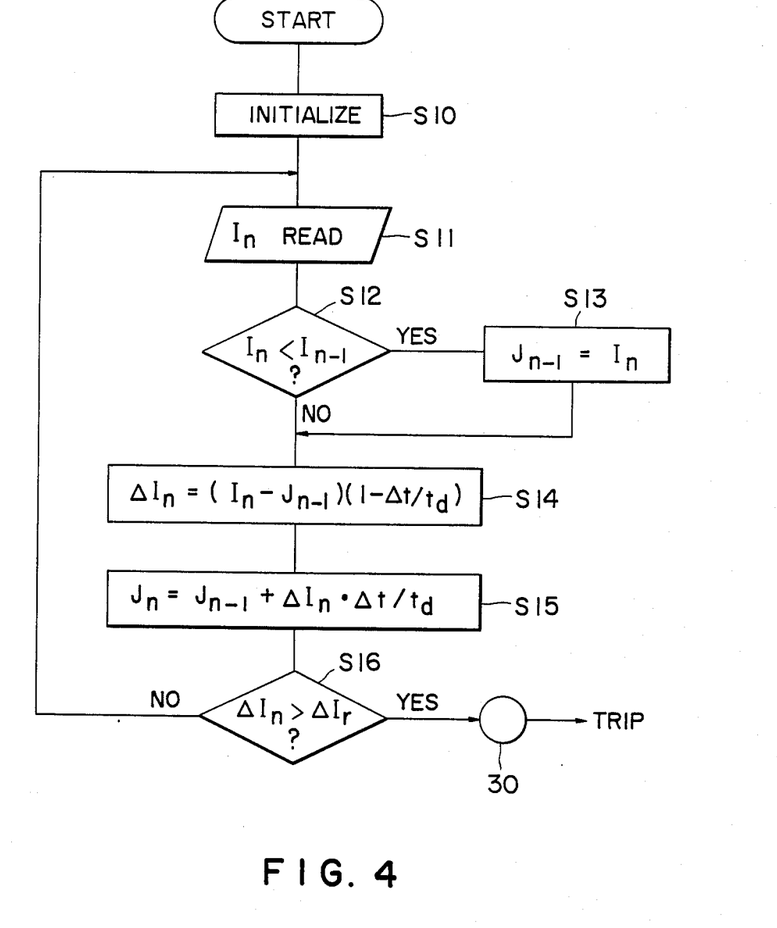
FIG. 4 is a flow chart shwoing an operation of the embodiment in FIG. 3.

An operation of the circuit portion including the sampler 22 through the setting device 29 which can be realized by the microcomputer will be described in detail with reference to a flow-chart shown in FIG. 4. After the device is initialized (step S10), a sequence of operations is repeated every sampling period $\Delta t$. Firstly, a sample value $I_n$ of the load current I is read out by the sampler 22 every sampling period $\Delta t$ (step S11). Then, the polarity of current variation, i.e., whether a current sample value $I_n$ is increased (positive) or decreased (negative) with respect to a preceding sample value $I_{n-1}$, is determined by the comparator 24 in step S12 by comparing the value $I_n$ with the value $I_{n-1}$ stored in the memory 25. When $I_n - I_{n-1} \geq 0$, i.e., $I_n \geq I_{n-1}$, it goes on to step 14. When $I_n - I_{n-1} < 0$, i.e., $I_n < I_{n-1}$, it goes on through step S13 to S14. The memory 25 stores a parameter $J_{n-1}$ which is obtained by weighting the sample $I_{n-1}$, when the current variation is positive. However, when $I_n < I_{n-1}$, the memory content $J_{n-1}$ of the memory 25 is substituted by the current sample value $I_n$ which is used as a new parameter $J_{n-1}$ (step S13). Then, the operation of the equation (3) is performed by the calculator 26 to obtain variable $\Delta I_{on}$ by using the new parameter $J_{n-1}$, the current sample value $I_n$, the sampling period $\Delta t$ set by the setting device 23 and the time constant $t_d$ set by the setting device 27 (step S14) and the operation of the equation (4) is performed by using the variable $\Delta I_{on}$, the sampling period $\Delta t$ and the time constant $t_d$ to up date the parameter $J_{n-1}$ to a new parameter $J_n$ (step S15). Then, the variable $\Delta I_{on}$ is compared by the comparator 28 with the set value $\Delta I_r$ set by the setting device 29 (step S16) and, when $\Delta I_{on} > \Delta I_r$, a fault detection signal $S_f$ is provided as described previously, upon which the high speed d.c. circuit breaker 2 is opened through the driver 30 and the trip coil 31. When $\Delta I_n \leq \Delta I_r$, the operation is judged as normal and returned to the step S11 to repeat the same sequence.

For the digital fault current detection device, an additional time required to add the logical operation (setp S12) for comparing the sample values prior to the operation of the variable $\Delta I_n$ related to a load current variation every sampling period $\Delta t$ is very small. Further, it is very easy to modify the initial value $J_{n-1}$ arbitrarily when the accumulating operation (step S15) is performed. Thus, in order to remove the current decreasing time which may have no direct relation to the judgement of whether or not the short-circuit fault exists, the parameter $J_{n-1}$ which is obtained according to the equation (4) as the initial current value at every sampling time by weighting with respect to the load current in the preceding specified time is substituted by the current sample value $I_n$ (step S13) during the current decreasing time ($I_n < I_{n-1}$). Therefore, it is possible to reflect the record of the load current immediately before the short-circuit fault to the parameter $J_{n-1}$.

Figure 5:
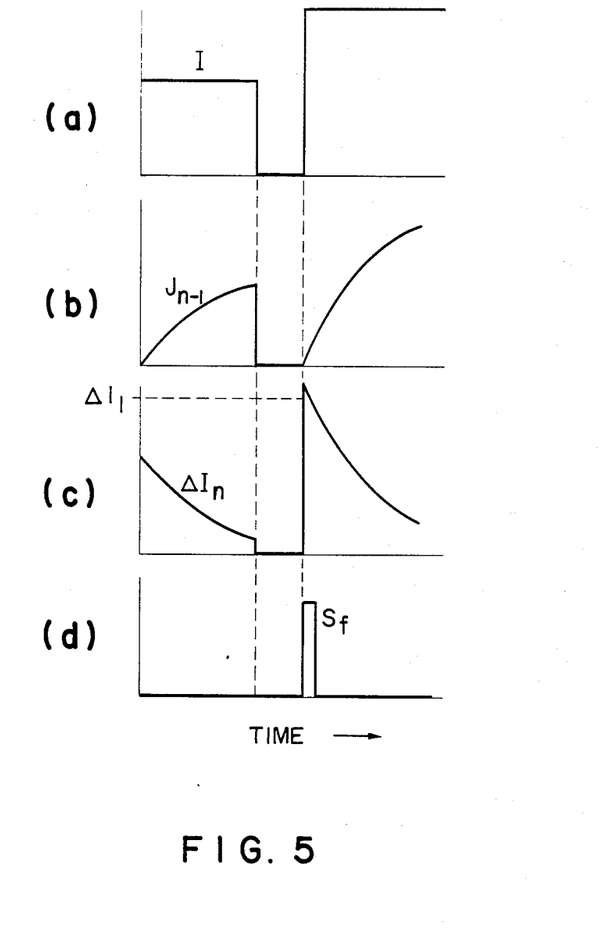
FIG. 5 is a graph showing a variation of a signal when a fault occurs.

FIG. 5 is a graph showing a typical load current I when a short-circuit fault is caused immediately after the load current decreases abruptly to zero. Considering nth sampling period in which a short-circuit is caused at a specified time after the load current I decreases abruptly to zero and a fault current starts to increase abruptly, with the parameter $J_{n-1}$ being reset to zero, only a time period after the current starts to decrease becomes important to discriminate between the load current and the fault current. Therefore, it is clear that a detection level of the variable $\Delta I_n$ at the occurrence of fault becomes higher comparing with a case where the parameter $J_{n-1}$ is not reset to zero. Therefore, the length of feeding section for which a reliable detection of fault can be increased and it becomes possible to detect the short-circuit fault easier.

Figure 6:
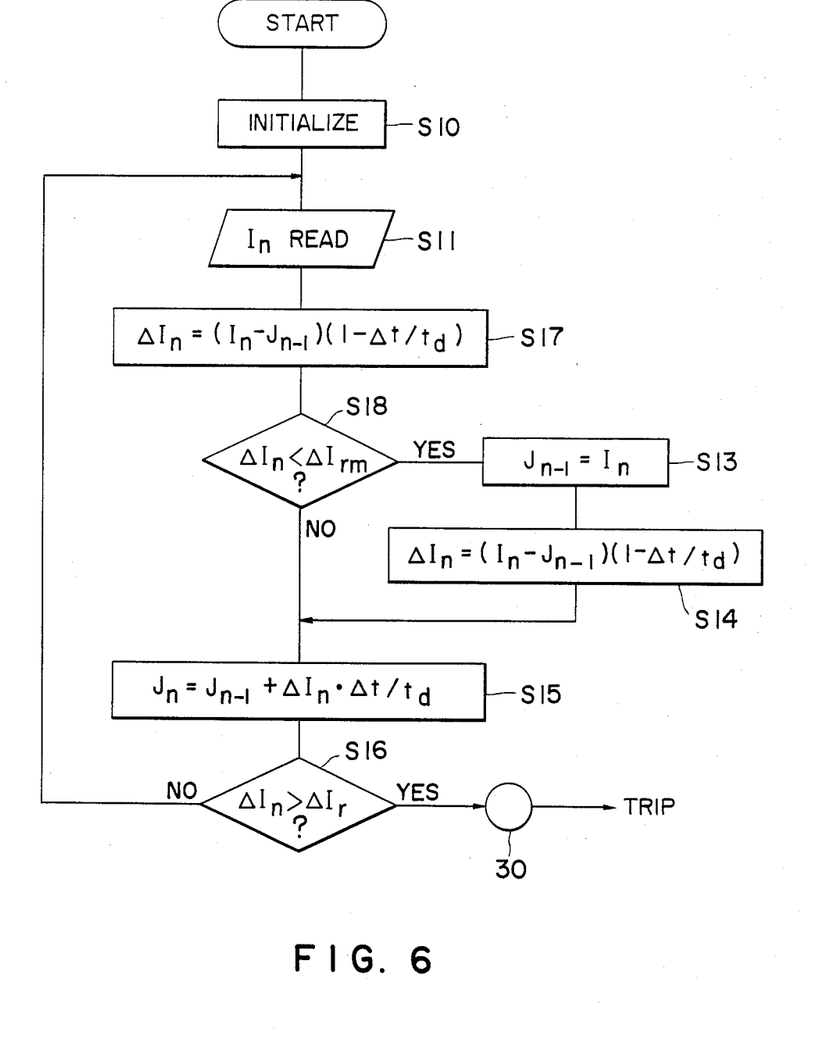
FIGS. 6 and 7 are flow charts for explanation of another embodiment of the present invention.

FIG. 6 is a flow chart of operation of an embodiment in which a positive set value $\Delta I_r$ and a negative set value $\Delta I_{rm}$ are set with respect to a variable $\Delta I_n$ and the parameter $J_{n-1}$ given as an initial current value is corrected every sampling period when the variable $\Delta I_n$ is lower than the negative set value $I_{rm}$. In this embodiment, a step S17 is performed according to the equation (3) after the steps 11 and the variable $\Delta I_n$ thus obtained is compared with the negative set value $\Delta I_{rm}$ (step S18). Then, the steps 13 ($J_{n-1} \leftarrow I_n$) described previously is performed and the operation of the equation (3) is performed again (step S14). Then, it goes on to the step S15 in which the equation (4) is performed. In the step S18, it goes on to the step S15 when $\Delta I_n \geq \Delta I_{rm}$. Otherwise, it is the same as that shown in FIG. 4.

This embodiment is simpler and more effective in a case where the load current contains ripples which are not negligible.

Figure 7:
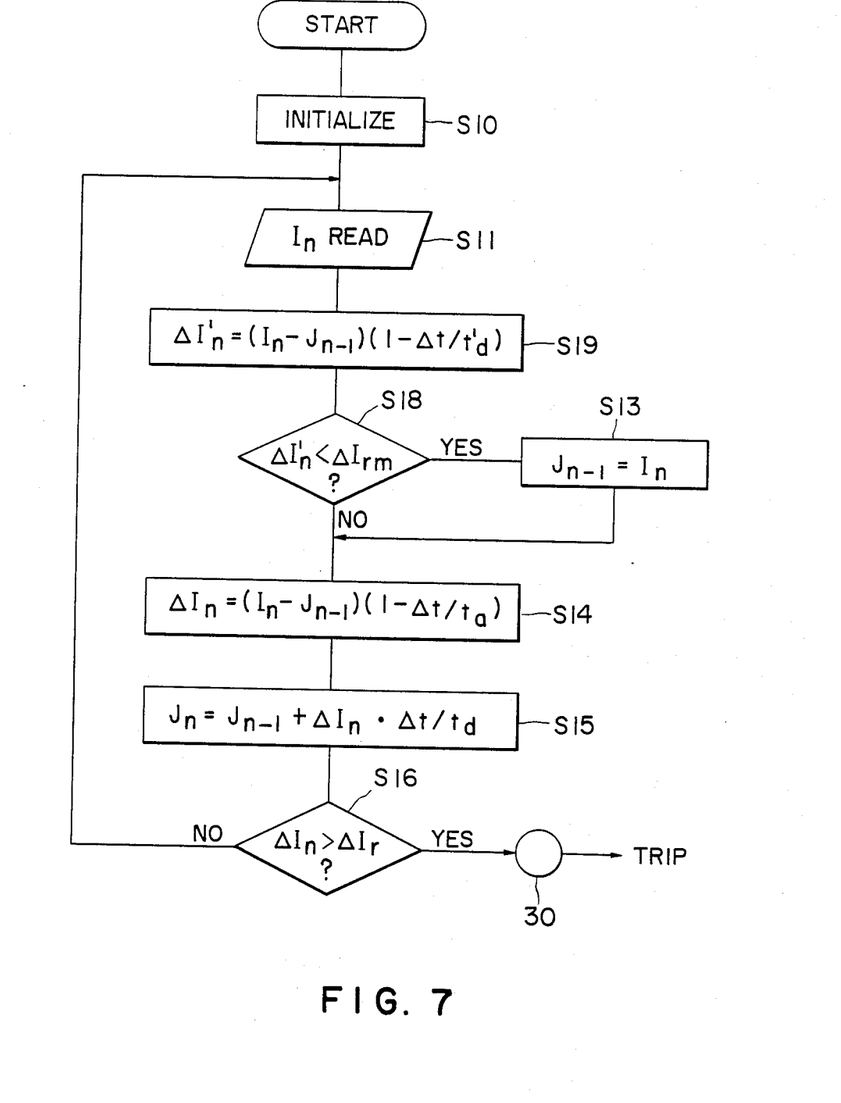

FIG. 7 is a flow chart of operation of another embodiment in which, in order to correct the parameter $J_{n-1}$ given as an initial current value every sampling time $\Delta t$, a variable $\Delta I_n'$ related to the record of the current is operated by using another time constant $t_d'$ (step S19) and the parameter $J_{n-1}$ is corrected (steps 18 and 13) when the variable $\Delta I_n'$ exceeds a negative set value $\Delta I_{rm}$.

This embodiment is effective when ripples contained in the load current are large.

Figure 8:
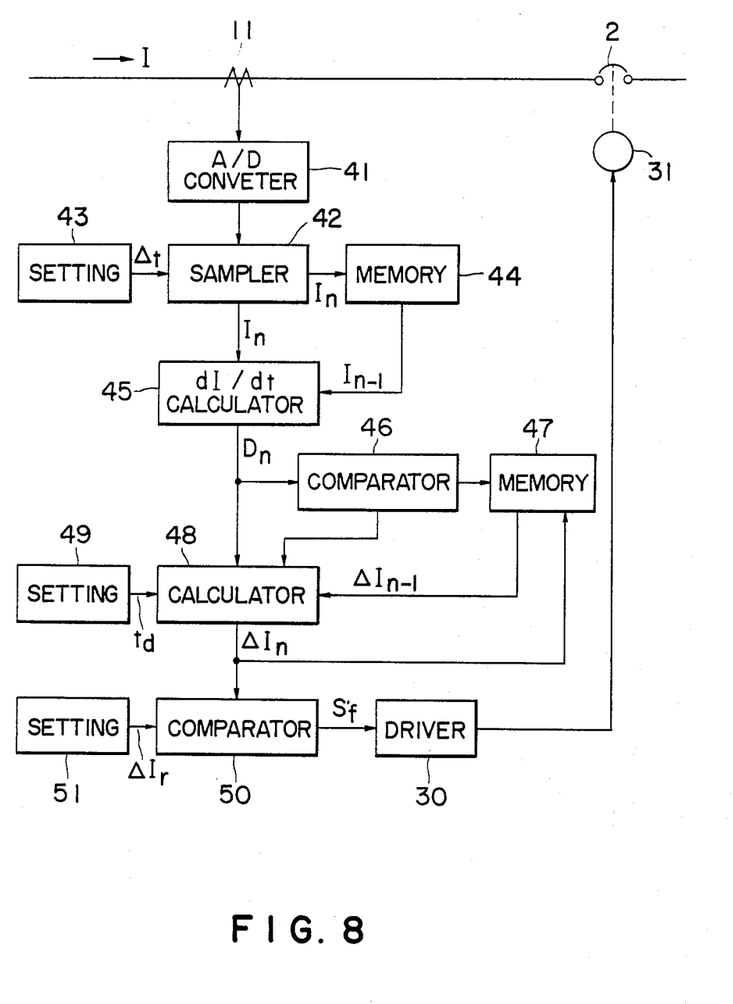
FIG. 8 is a block diagram showing an embodiment of the present invention based on the principle shown in FIG. 2.

FIG. 8 shows another embodiment which detects a fault on the basis of a variation rate of load current. The load current I detected by a current transformer 11 is converted by an A/D converter 41 into a digital signal and sampled by a sampler 42 every sampling time $\Delta t$. nth sample value $I_n$ is stored in a memory 44 and supplied to a calculator 45. The sampling period $\Delta t$ is set by a setting device 43. The sampler 42 through a setting device 51 to be described are constructed with a microcomputer. The calculator 45 calculates a variation rate $D_n$ for a current sample value $I_n$ by using the current sample value $I_n$ and a preceding value $I_{n-1}$ stored in the memory 44 as $D_n = dI_n/dt = (I_n - I_{n-1})/\Delta t$. The polarity of the rate $D_n$ is determined by a comparator 46 and when $D_n < 0$, $\Delta I_n = 0$. When $D_n \geq 0$, an operation to be described is performed by a calculator 48 by using the preceding variable $\Delta I_{n-1}$ stored in a memory 47, the sampling period $\Delta t$ set by the setting device 43, the time constant $t_d$ set by a setting device 49 and the rate $D_n$ calculated by the calculator 45, to provide a new variable $\Delta I_n$. The latter variable is stored in the memory 47 and is compared by a comparator 50 with the value $\Delta I_r$ set by the setting device 51. When $\Delta I_n > \Delta I_r$, it is determined that there is a short-circuit current in a trolley wire carrying the load current I upon which a d.c. high speed circuit breaker 2 is opened through a driver 30 and a trip coil 31.

Figure 9:
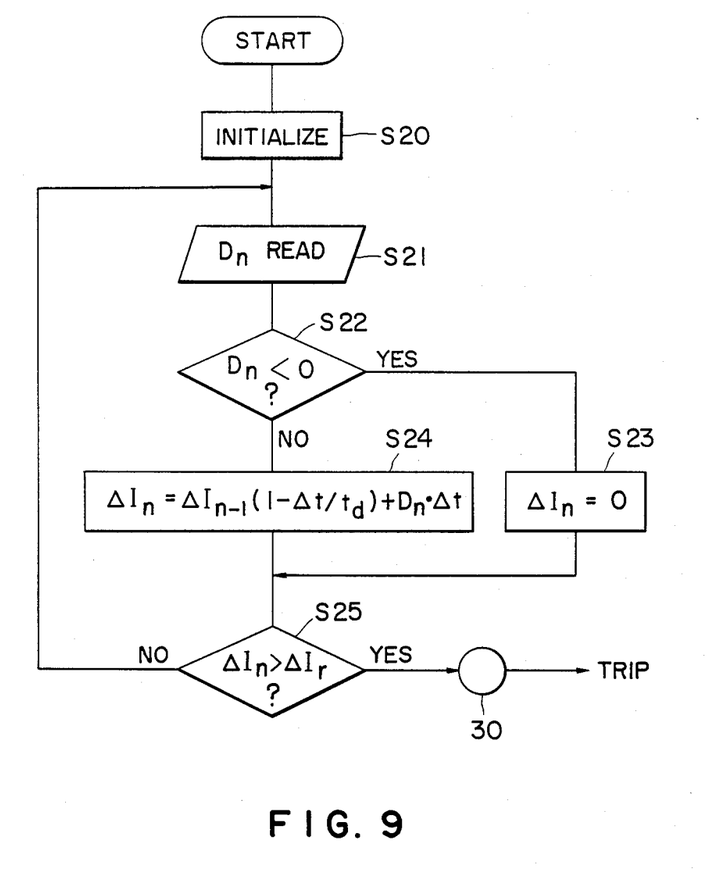
FIG. 9 is a flow chart for explanation of operation of the embodiment shown in FIG. 8.

An operation of the circuit composed of the sampler 42 through the setting device 51 and realized by the microcomputer will be described with reference to a flow chart shown in FIG. 9. After the device is initialized (step S20), a sequence of operation is repeated every sampling period $\Delta t$. Firstly, the current variation rate $D_n$ obtained by the calculator 45 is read out every sampling period $\Delta t$ (step S21). Then, the polarity of the rate $D_n$ is compared by the comparator 46 (step S22). The calculator 48 performs the operation of the equation (8) with $\Delta I_n = 0$ when $D_n < 0$ (step S23) and with the preceding variable $\Delta I_{n-1}$, the sampling period $\Delta t$, the time constant $t_d$ and the rate $D_n$ when $D_n \geq 0$ (step S24), to obtain a new variable $\Delta I_n$. Thereafter, the variable $\Delta I_n$ is compared by the comparator 50 with the set value $\Delta I_r$ (step S25) and a fault detection signal $S_f$ is provided when $\Delta I_n > \Delta I_r$ to open the circuit breaker 2 through the driver 30 and the trip coil 31. When $\Delta I_n \leq \Delta I_r$, the operation is decided as normal and returned to the step S21 to repeat the same sequence.

This embodiment causes the variation of load current prior to the occurrence of short-circuit fault to be reflected to the variable, enlarges the length of feeding section in which such fault can be reliably determined and allows such fault to be detected earlier, as in the embodiments shown in FIGS. 3 and 4 described with reference to FIG. 5.

Figure 10:
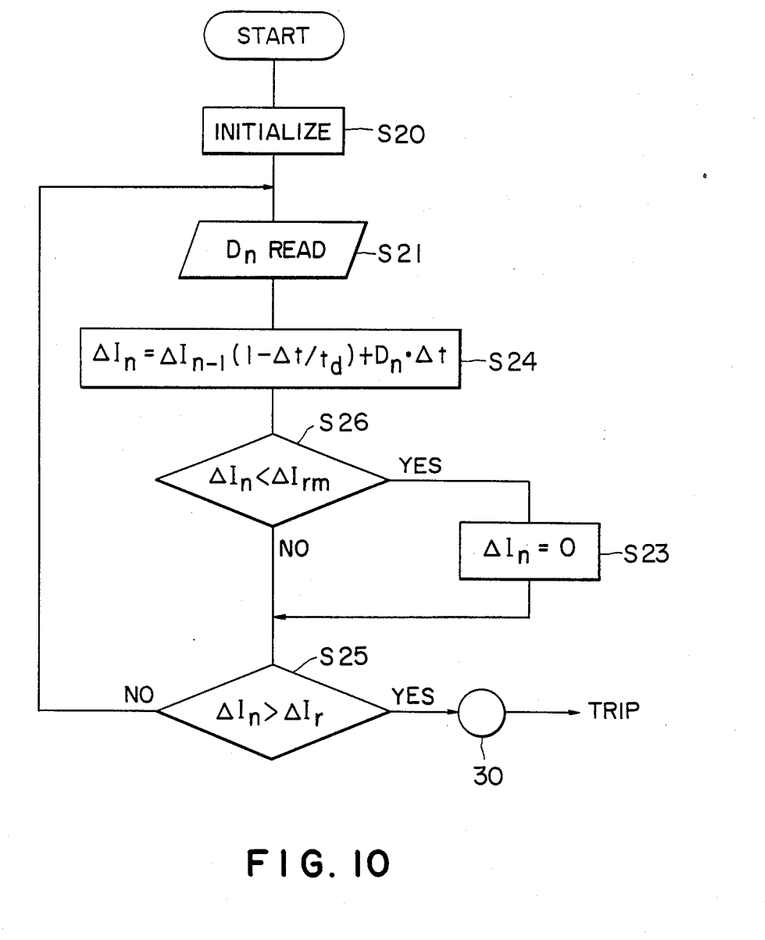
FIGS. 10 and 11 are flow charts for explanation of another embodiment of the present invention.

FIG. 10 is a flow chart of another embodiment in which a positive and negative values $\Delta I_r$ and $\Delta I_{rm}$ are set with respect to a variable $\Delta I_n$ and the latter is made zero when $\Delta I_n < \Delta I_{rm}$. In this embodiment, after a step S21, a step S24 is performed to operate the equation (8). A resultant variable $\Delta I_n$ is compared with the negative set value $\Delta I_{rm}$ (step S26) and, when $\Delta I_n < \Delta I_{rm}$, it is made $\Delta I_n = 0$ (step S23) and, when $\Delta I_n \geq \Delta I_{rm}$, the operation goes to a step S25. Other operations are the same as those shown in FIG. 9.

This embodiment is very effective when the load current contains ripples which cannot be ignored.

Figure 11:
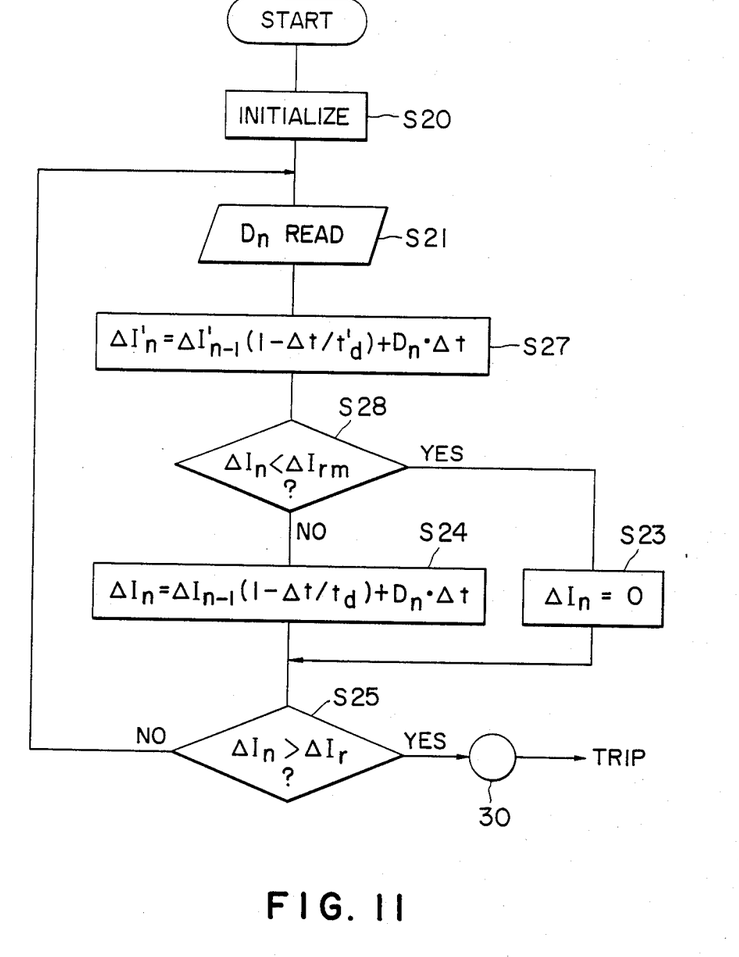

FIG. 11 is a flow chart of operation of another embodiment in which a variable $\Delta I_n'$ related to a variation of current is operated with using another time constant $t_d'$ (step S27) and the variable is corrected when $\Delta I_n'$ exceeds a negative set value $\Delta I_{rm}$ (steps S28 and S23). This embodiment is effective when an influence of ripples contained in the load current is considerable.

Figure 12:
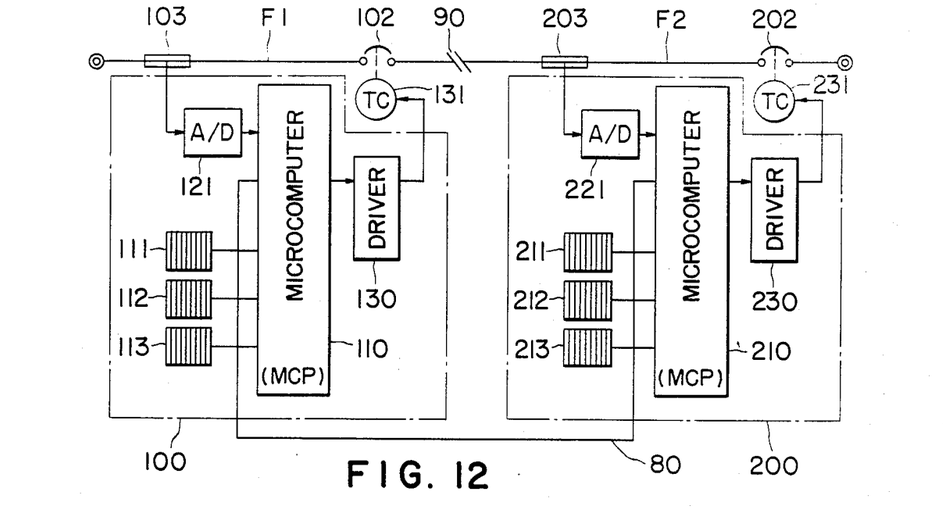
FIG. 12 is a circuit diagram of an embodiment of the present invention for dead section compensation.

When the electric car is powered from an upstream feeder F1 to a downstream feeder F2 crossing over a section 90 as shown in FIG. 12, a current of the feeder F1 decreases abruptly while that of the feeder F2 increases abruptly. Therefore, a fault current discriminator 200 for the feeder F2 might operate unnecessarily. In order to prevent such unnecessary operation from occurring, it may be possible to take the currents of the feeder F1 detected by a shunt 103 into a microcomputer 110 of its fault current detection device 100 through A/D converter 121 and into a microcomputer 210 of a fault current discriminator 200 for the downstream feeder F2 through a coupling line 80 to compare a decrease of current of the upstream feeder F1 with an increase of current of the downstream feeder F2 and to open d.c. high speed circuit breakers 102 and 202 through drivers 130 and 230 and trip coils 131 and 231, respectively, when it is decided that there is a fault. The microcomputers (MCP) 110 and 210 include memories 111-113 and 211-213, respectively.

Figure 13:
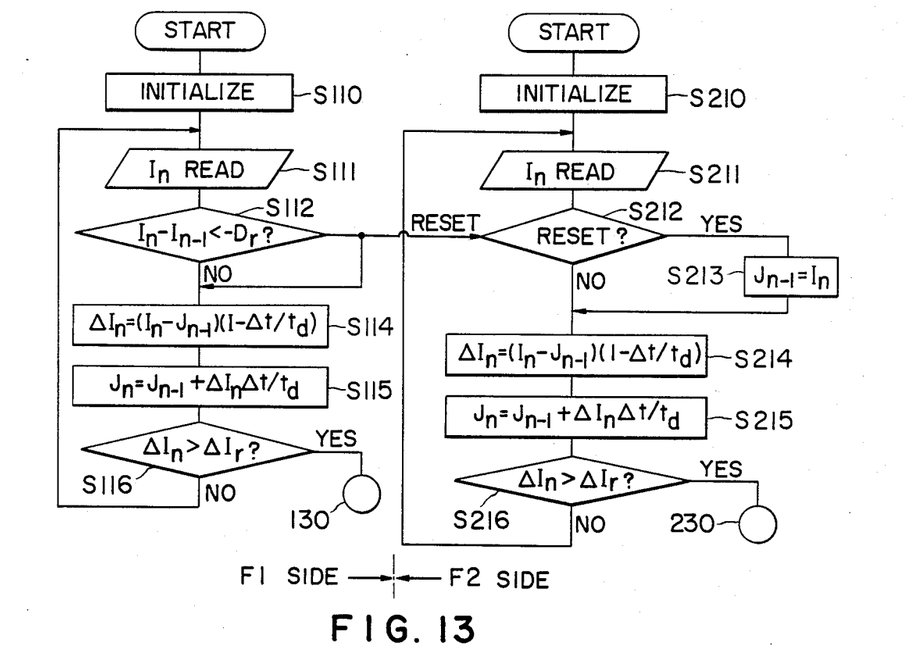
FIG. 13 is a flow chart for explanation of operation of the embodiment in FIG. 12.

Functions of the MCPs 110 and 210 in FIG. 12 will be described with reference to a flow chart shown in FIG. 13. It is assumed that the electric car is driven to move from the feeder F1 to the feeder F2. After the device is initialized (steps S110, S210), a sequence of operations is performed every sampling time $\Delta t$. Firstly, a sample value $I_n$ of a load current I is read out every sampling period $\Delta t$ (steps S111, S211). Then, on the side of the feeder F1, it is determined whether or not a difference between a current sample value $I_n$ and a preceding sample value $I_{n-1}$ is lower than a predetermined set value $-D_r$, i.e., whether or not the difference is negative and an absolute value thereof is larger than $D_r$, (step S112). When YES (which corresponds to a situation immediately after the electric car cross-overs the section 90), a variable $J_{n-1}$ is substituted for the sample value $I_n$ in steps S212 and S213 on the side of the feeder F2. The step S212 determines whether or not the variable $J_{n-1}$ is reset, depending upon whether or not a reset instruction corresponding to YES is given by the step S112. When there is the reset instruction, the operation goes to the step S213. The operation goes to a step 214 when the step S212 provides NO or after the step 213. On the other hand, when the step S112 provides NO, the operation goes to a step S114. Operations of $\Delta I_n$ and $J_n$ according to the equations (3) and (4) are performed in the steps S114, S214 and S115, S215, respectively. Finally, it is determined in steps S116 and S216 whether or not the variables $\Delta I_n$ obtained in the steps S114 and S214 exceed values $\Delta I_r$ set according to the equation (5). When YES, the d.c. high speed circuit breakers 102 and 202 are opened through the drivers 130 and 230. When NO, the operations are returned to the steps S111 and S211 to repeat the same sequences, respectively.

In this embodiment, in order to avoid an erroneous fault detection due to the abrupt increase of current of the downstream feeder F2 immediately after the powered electric car passed from the upstream feeder F1 through the intermediate section 90 between the feeders F1 and F2 just enters into the downstream feeder 2, the initial value $J_{n-1}$ for integration operation of the detection device on the side of the feeder F2 is substituted by $I_n$ only for that short time and the pair of detection devices are operated independently in other time. With such scheme, the unnecessary malfunction of the detection devices due to the abrupt current increase at the time when the electric car passes through the section is prevented, causing the detection of short-circuit fault to be more reliable.

As mentioned hereinbefore, according to the present invention, it is considered every sampling period $\Delta t$ whether or not the current is decreased or the current variation rate is negative and, when the current decreases, a compensation is performed by substituting a parameter $J_{n-1}$ for a current sample value $I_n$ or, when the variation rate is negative, a variable $\Delta I_n$ representing an amount of current variation is made zero. Therefore, even when the load current decreases abruptly immediately before an occurrence of short-circuit fault, the variable $\Delta I_n$ used to determine the existence of fault is not influenced thereby. Therefore, even when the running frequency of the electric train is high with high variation of load current, it is possible to discriminate between the load current and the fault current reliably.

Further, it is possible to prevent an erroneous fault detection of an increase of current when the train passes through the section by considering the polarity and absolute value of a deviation $I_n-I_{n-1}$ of input current to the detection device on the upstream side every sampling period $\Delta t$ and making the variable $\Delta I_n$ on the downstream side zero when the polarity is negative and the absolute value is larger than a certain value $D_r$.

What is claimed is:

1. A fault current detection device for a d.c. network, comprising:
   sampling means for obtaining a series of sample values by sampling, every sampling period, a current flowing through the d.c. network;
   first comparator means for comparing a current sample value $I_n$ obtained currently by said sampling means with a preceding sample value $I_{n-1}$ to determine a sign of a deviation $\Delta I = I_n = I_{n-1}$;
   calculation means for calculating a variable $\Delta I_n$ representative of an amount of current variation with respect to said current sample value $I_n$ on the basis of a difference $I_n - J_{n-1}$ between said current sample value $I_n$ and a parameter $J_{n-1}$ obtained by correcting, every sampling period, and weighting sample values within a preceding constant time period when said deviation $\Delta I$ is positive and on the basis of a difference $I_n - J_{n-1}$ between said current sample value $I_n$ and a new parameter $J_{n-1}$ obtained by substituting said parameter $J_{n-1}$ for said current sample value $I_n$ when said deviation $\Delta I$ is negative; and
   second comparator means for comparing said variable $\Delta I_n$ with a preset value $\Delta I_r$ to provide a fault current detection signal when $\Delta I_n > \Delta I_r$.

2. The fault current detection device as claimed in claim 1, wherein a positive set value $\Delta I_r$ and a negative set value $\Delta I_{rm}$ are set as a set value for said variable $\Delta I_n$ related to a record in the past of load current and said parameter $J_{n-1}$ is corrected every sampling period $\Delta t$ when said variable $\Delta I_n$ is negative and has a value lower than said negative set value $\Delta I_{rm}$.

3. The fault current detection device as claimed in claim 2, wherein a variable $\Delta I_n'$ related to the record in the past of load current is calculated by using a time constant different from said time constant of said parameter $J_{n-1}$.

4. A fault current detection device for a d.c. network, comprising:
   sampling means for obtaining a series of sample values by sampling, every sampling period, a current flowing through the d.c. network;

first calculation means for calculating a current variation rate $D_n = dI/dt$ from a current sample value sampled currently by said sampling means and a preceding sample value;

second calculation means, on the basis of said variation rate $D_n$ and a variable $\Delta I_{n-1}$ representative of a current variation amount $D_{n-1}$ with respect to a preceding sampling period, for updating it to a new variable $\Delta I_n$ when said current variation rate $D_n$ calculated by said first calculation means is positive and for removing said variable $\Delta I_{n-1}$ representative of said preceding current variation amount and making said new variable $\Delta I_n$ with respect to a current variation rate $D_n$ zero when said variation rate $D_n$ is negative; and comparator means for comparing said new variable $\Delta I_n$ obtained by said second calculation means with a predetermined set value $\Delta I_r$ to provide a fault current detection signal when $\Delta I_n > \Delta I_r$.

5. The fault current detection device as claimed in claim 4, wherein a positive set value $\Delta I_r$ and a negative set value $\Delta I_{rm}$ are set with respect to said variable $\Delta I_n$ related to said current variation amount and said variable $\Delta I_n$ is made zero when said variable $\Delta I_n$ is negative and has a value lower than said set value $\Delta I_{rm}$.

6. The fault current detection device as claimed in claim 5, wherein a variable $\Delta I_n'$ related to a current variation amount is calculated by using a time constant different from said time constant of said variable $\Delta I_n$.

7. A fault current detection device for each of a plurality of series arranged d.c. feeding lines for feeding an electric car running unidirectionally, comprising:

sampling means for obtaining a series of sample values by sampling, every sampling period, a current flowing through said feeding line;

means for calculating a variable $\Delta I_n$ representative of an amount of current variation experienced on the basis of a difference between a currently sampled value $I_n$ and a previously weighted current value $J_{n-1}$ so long as said currently sampled value $I_n$ obtained by said sampling means is not lower than a previously sampled value $I_{n-1}$ by an amount substantially larger than a predetermined value $D_r$;

means for calculating a newly weighted current value $J_n$ by using said variable $\Delta I_n$ to update said current value $J_{n-1}$;

comparing means for comparing said variable $\Delta I_n$ with a preset value $\Delta I_r$ to provide a fault current detection signal when $\Delta I_n > \Delta I_r$;

means for providing a reset signal to an adjacent downstream feeding line to reset its current value $J_{n-1}$ when said currently sampled value $I_n$ is lower than said previously sampled value $I_{n-1}$ by an amount substantially larger than said predetermined value $D_r$; and means responsive to said reset signal from an adjacent upstream feeding section for substituting said previously weighted current value $J_{n-1}$ for said currently sampled value $I_n$ prior to said calculation of said variable $\Delta I_n$.

* * * * *